United States Patent
Palaniappan et al.

(10) Patent No.: US 11,201,188 B2
(45) Date of Patent: Dec. 14, 2021

(54) IMAGE SENSORS WITH HIGH DYNAMIC RANGE AND FLICKER MITIGATION

(71) Applicant: SEMICONDUCTOR COMPONENTS INDUSTRIES, LLC, Phoenix, AZ (US)

(72) Inventors: Nanda Palaniappan, Milpitas, CA (US); Minseok Oh, San Jose, CA (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 218 days.

(21) Appl. No.: 16/502,435

(22) Filed: Jul. 3, 2019

(65) Prior Publication Data

US 2020/0286945 A1  Sep. 10, 2020

Related U.S. Application Data

(60) Provisional application No. 62/815,026, filed on Mar. 7, 2019.

(51) Int. Cl.
*H01L 27/146* (2006.01)
*H04N 5/235* (2006.01)
(Continued)

(52) U.S. Cl.
CPC .. *H01L 27/14656* (2013.01); *H01L 27/14603* (2013.01); *H01L 27/14612* (2013.01);
(Continued)

(58) Field of Classification Search
CPC ......... H01L 27/14656; H01L 27/14603; H01L 27/14612; H04N 5/2355; H04N 5/35572;
(Continued)

(56) References Cited

U.S. PATENT DOCUMENTS

2009/0045319 A1  2/2009  Sugawa et al.
2016/0165159 A1* 6/2016  Hseih ................. H04N 5/37457
                                                            348/273
(Continued)

FOREIGN PATENT DOCUMENTS

EP       1887626 A1    2/2008
WO    2013008425 A1    1/2013

*Primary Examiner* — Jennifer D Bennett
(74) *Attorney, Agent, or Firm* — Treyz Law Group, P.C.; Joseph F. Guihan

(57) ABSTRACT

An imaging device may have an array of image sensor pixels. Each image sensor pixel of the array of image sensor pixels may have first and second photodiodes with different sensitivities. The photodiode having the lower sensitivity may be coupled to a storage diode and may alternately discard charge and transfer charge to the storage diode during an integration time for flicker mitigation. The length of time for which charge is discarded in each shutter cycle for flicker mitigation may be selected to adjust dynamic range of the imaging pixel. Upon conclusion of the integration time, charge from the storage diode may be sampled in a high conversion gain readout. Overflow charge from a dual conversion gain capacitor may then be sampled in a low conversion gain readout. Charge from the photodiode having higher sensitivity may finally be sampled in a high conversion gain readout.

16 Claims, 5 Drawing Sheets

(51) Int. Cl.
  *H04N 5/355* (2011.01)
  *H04N 5/359* (2011.01)
  *H04N 5/3745* (2011.01)

(52) U.S. Cl.
  CPC ......... *H04N 5/2355* (2013.01); *H04N 5/2357* (2013.01); *H04N 5/3559* (2013.01); *H04N 5/3592* (2013.01); *H04N 5/35572* (2013.01); *H04N 5/37452* (2013.01)

(58) Field of Classification Search
  CPC .... H04N 5/3559; H04N 5/3575; H04N 5/243; H04N 9/04557; H04N 5/3592; H04N 5/37457; H04N 5/2357; H04N 5/37452
  See application file for complete search history.

(56) References Cited

U.S. PATENT DOCUMENTS

| | | | |
|---|---|---|---|
| 2016/0286151 A1* | 9/2016 | Lahav | H01L 27/14609 |
| 2018/0115730 A1* | 4/2018 | Velichko | H04N 5/3559 |
| 2018/0124335 A1* | 5/2018 | Machida | H04N 5/3745 |
| 2019/0306442 A1* | 10/2019 | Murakami | H04N 5/355 |

* cited by examiner

IMAGE SENSORS WITH HIGH DYNAMIC RANGE AND FLICKER MITIGATION

CROSS-REFERENCE TO RELATED APPLICATIONS

This application claims the benefit of U.S. Provisional Patent Application No. 62/815,026, filed on Mar. 7, 2019, the entire contents of which is incorporated herein by reference.

BACKGROUND

This relates generally to imaging devices, and more particularly, to image sensors that include high dynamic range imaging sensor pixels.

Image sensors are commonly used in electronic devices such as cellular telephones, cameras, and computers to capture images. In a typical arrangement, an image sensor includes an array of image pixels arranged in pixel rows and pixel columns. Circuitry may be coupled to each pixel column for reading out image signals from the image pixels.

Typical image pixels contain a photodiode for generating charge in response to incident light. Conventional imaging systems may have images with artifacts associated with low dynamic range. Scenes with bright and dark portions may produce artifacts in conventional image sensors, as portions of the low dynamic range images may be over exposed or under exposed. Image sensors may therefore be equipped with high dynamic range (HDR) functionality, where multiple images are captured with an image sensor with different exposure times. The images are later combined into a high dynamic range image, but this can introduce motion artifacts, especially in dynamic scenes with non-static objects.

It would therefore be desirable to be able to provide imaging devices with improved high dynamic range image sensor pixels.

DETAILED DESCRIPTION

Embodiments of the present invention relate to image sensors, and more particularly, to image sensors having pixels with high dynamic range (HDR) functionality. It will be recognized by one skilled in the art, that the present exemplary embodiments may be practiced without some or all of these specific details. In other instances, well known operations have not been described in detail in order to not unnecessarily obscure the present embodiments.

Imaging systems having digital camera modules are widely used in electronic devices such as digital cameras, computers, cellular telephones, and other electronic devices. A digital camera module may include one or more image sensors that gather incoming light to capture an image. Image sensors may include arrays of image pixels. The pixels in the image sensors may include photosensitive elements such as photodiodes that convert the incoming light into electric charge. Image sensors may have any number of pixels (e.g., hundreds or thousands or more). A typical image sensor may, for example, have hundreds, thousands, or millions of pixels (e.g., megapixels). Image sensors may include control circuitry such as circuitry for operating the image pixels and readout circuitry for reading out image signals corresponding to the electric charge generated by the photosensitive elements.

Figure 1:
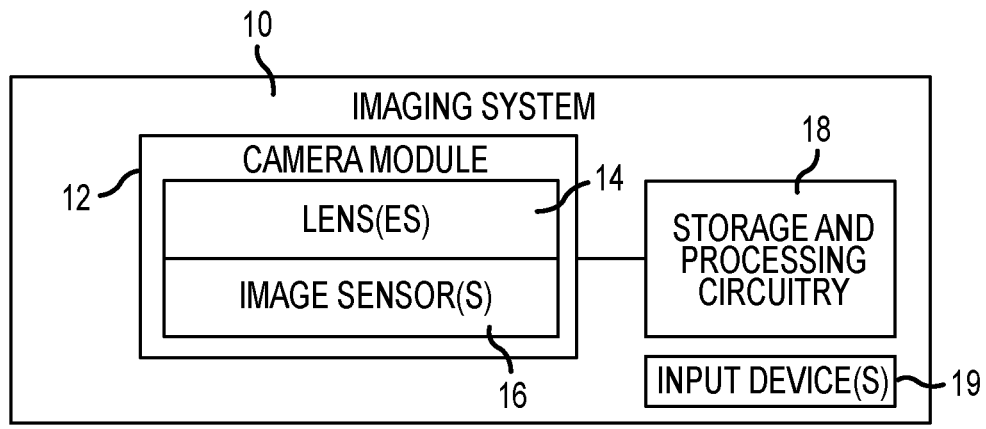
FIG. 1 is a diagram of an illustrative electronic device having an image sensor and processing circuitry for capturing images using an array of image pixels in accordance with an embodiment.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Imaging system 10 may also include one or more input devices 19. Input devices 19 may include one or more keypads, ports, buttons, joysticks, touch sensors, touch-sensitive displays, etc. Input devices 19 may be used to receive user input from a user operating the imaging system. For example, a user may select various settings associated with the image sensor using the one or more input devices.

Figure 2:
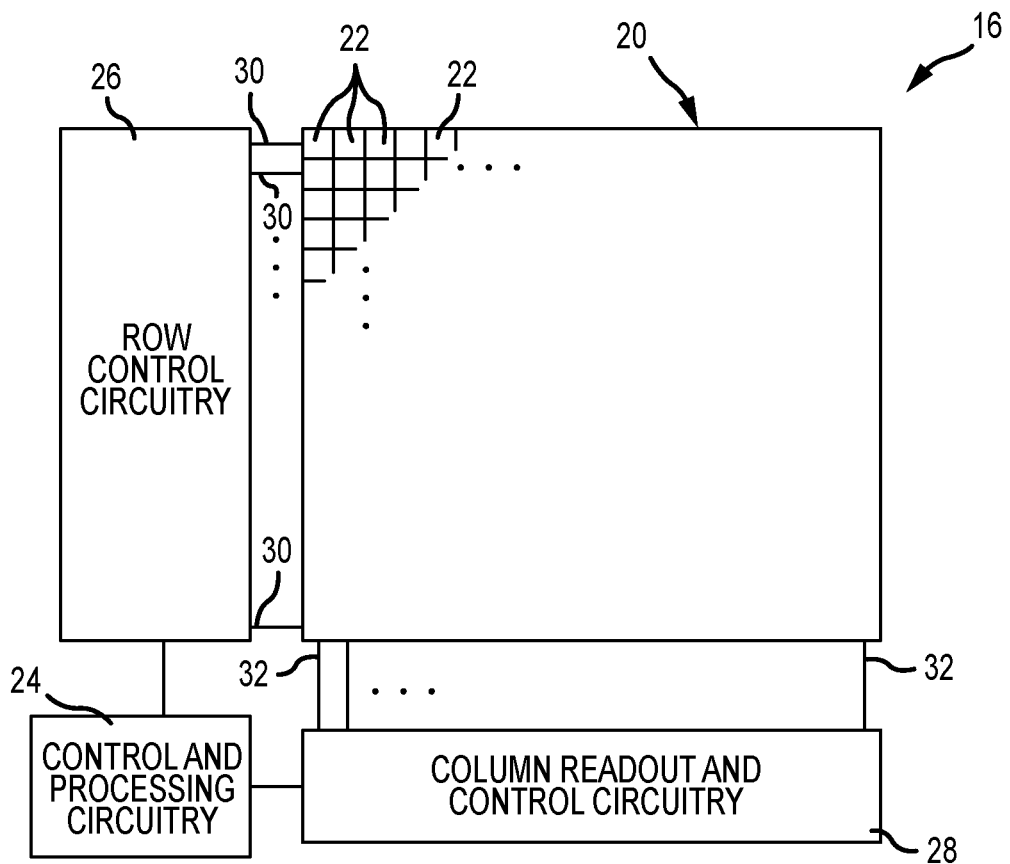
FIG. 2 is a diagram of an illustrative pixel array and associated readout circuitry for reading out image signals from the pixel array in accordance with an embodiment.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 (sometimes referred to as column readout and control circuitry 28) may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

If desired, image pixels 22 may include one or more photosensitive regions for generating charge in response to image light. Photosensitive regions within image pixels 22 may be arranged in rows and columns on array 20. Pixel array 20 may be provided with a color filter array having multiple color filter elements which allows a single image sensor to sample light of different colors. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 22.

Image sensor 16 may be configured to support a global shutter operation (e.g., pixels 22 may be operated in a global shutter mode). For example, the image pixels 22 in array 20 may each include a photodiode, floating diffusion region, and local charge storage region. With a global shutter scheme, all of the pixels in the image sensor are reset simultaneously. A charge transfer operation is then used to simultaneously transfer the charge collected in the photodiode of each image pixel to the associated charge storage region. Data from each storage region may then be read out on a per-row basis, for example.

If desired, array 20 may be part of a stacked-die arrangement in which pixels 22 of array 20 are split between two or more stacked substrates. In such an arrangement, each of the pixels 22 in the array 20 may be split between the two dies at any desired node within pixel. As an example, a node such as the floating diffusion node may be formed across two dies. Pixel circuitry that includes the photodiode and the circuitry coupled between the photodiode and the desired node (such as the floating diffusion node, in the present example) may be formed on a first die, and the remaining pixel circuitry may be formed on a second die. The desired node may be formed on (i.e., as a part of) a coupling structure (such as a conductive pad, a micro-pad, a conductive interconnect structure, or a conductive via) that connects the two dies. Before the two dies are bonded, the coupling structure may have a first portion on the first die and may have a second portion on the second die. The first die and the second die may be bonded to each other such that first portion of the coupling structure and the second portion of the coupling structure are bonded together and are electrically coupled. If desired, the first and second portions of the coupling structure may be compression bonded to each other. However, this is merely illustrative. If desired, the first and second portions of the coupling structures formed on the respective first and second dies may be bonded together using any known metal-to-metal bonding technique, such as soldering or welding.

As mentioned above, the desired node in the pixel circuit that is split across the two dies may be a floating diffusion node. Alternatively, the node between a floating diffusion region and the gate of a source follower transistor (i.e., the floating diffusion node may be formed on the first die on which the photodiode is formed, while the coupling structure may connect the floating diffusion node to the source follower transistor on the second die), the node between a floating diffusion region and a source-drain node of a transfer transistor (i.e., the floating diffusion node may be formed on the second die on which the photodiode is not located), the node between a source-drain node of a source-follower transistor and a row select transistor, or any other desired node of the pixel circuit may be split across the two dies.

Figure 3:
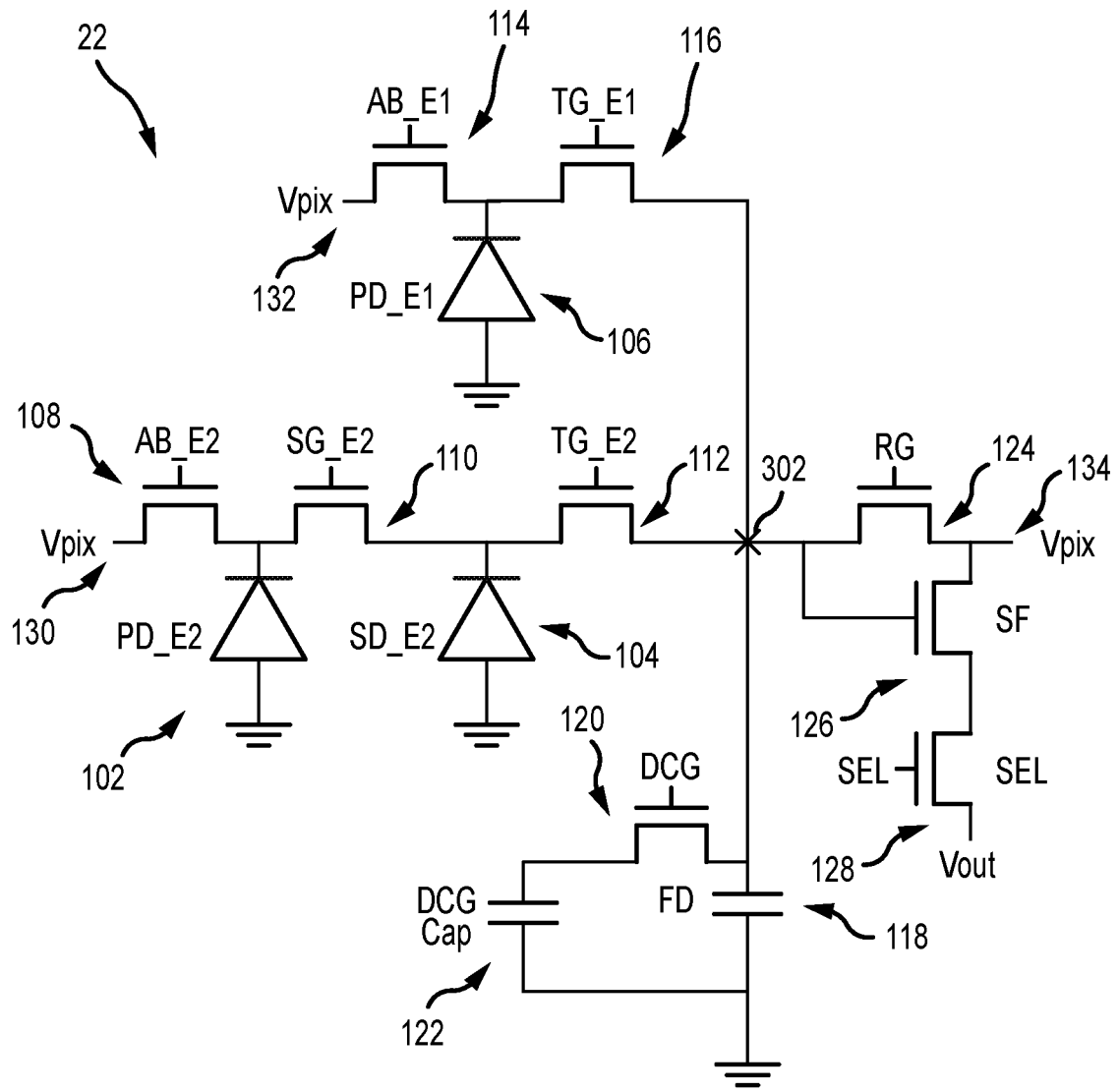
FIG. 3 is a circuit diagram of an illustrative imaging pixel configured to obtain high dynamic range image data while performing flicker mitigation in accordance with an embodiment.

FIG. 3 is a circuit diagram of an illustrative imaging pixel having multiple photosensitive areas. As shown, imaging pixel 22 includes a first photosensitive area 106 (PD_E1) and a second photosensitive area 102 (PD_E2). Photosensitive areas 102 and 106 may be photodiodes, for example. Photodiode 106 is coupled to a node between an anti-blooming transistor 114 and transfer transistor 116. Anti-blooming transistor 114 is configured to selectively couple photodiode 106 to bias voltage supply terminal 132 (that provides a bias voltage Vpix). Transfer transistor 116 is configured to selectively transfer charge from photodiode 106 to floating diffusion region 118. Both photodiodes 102 and 106 may be covered by a single color filter element (e.g., color filter element material of the same color).

Photosensitive area 102 is coupled to a node between anti-blooming transistor 108 and transfer transistor 110 (sometimes referred to as storage gate transfer transistor 110). Transfer transistor 110 may be a storage gate and is therefore sometimes referred to as storage gate 110. Anti-blooming transistor 108 is configured to selectively couple photodiode 102 to bias voltage supply terminal 130 (that provides a bias voltage Vpix). Storage gate 110 is configured to selectively transfer charge from photodiode 102 to charge storage region 104. In FIG. 3, charge storage region 104 is depicted as being a charge storage photodiode. This example is merely illustrative. If desired, charge storage region 104 may instead be formed from a storage capacitor, a storage gate, or any other desired components that can store charge.

Transfer transistor 112 is configured to selectively transfer charge from charge storage region 104 to floating diffusion region 118. Floating diffusion region 118 may have an associated capacitance (represented by capacitor FD in FIG. 3). To increase the capacitance of the floating diffusion region (and therefore reduce the gain of readout from the floating diffusion region), floating diffusion region 118 may be selectively coupled to dual conversion gain capacitor 122 (DCG CAP) by transistor 120.

Floating diffusion region 118 may also be coupled to a gate terminal of source follower transistor 126. Source follower transistor 126 has a first source-drain terminal coupled to a row select transistor 128 and a second source-drain terminal coupled to bias voltage supply terminal 134 (that provides a bias voltage Vpix). In this application, each transistor is illustrated as having three terminals, a source, a drain, and a gate. The source and drain terminals of each transistor may be changed depending on how the transistors are biased and the type of transistor used. For the sake of simplicity, the source and drain terminals are referred to herein as source-drain terminals or simply terminals. When row select transistor 128 is asserted, a voltage Vout corresponding to the amount of charge in floating diffusion region 118 will be output form the pixel (e.g., onto a column line such as column line 32 in FIG. 2). Reset transistor 124 is coupled between bias voltage supply terminal 134 and floating diffusion region 118. Reset transistor 124 may be asserted to reset the amount of charge in floating diffusion region 118.

In FIG. 3, three separate bias voltage supply terminals 130, 132, and 134 are depicted. However, it should be understood that any subset of these bias voltage supply terminals may optionally be shared. The bias voltage supply terminals may provide the same bias voltages or may provide different bias voltages.

A gate terminal of anti-blooming transistor 114 receives anti-blooming transistor control signal AB_E1. A gate terminal of anti-blooming transistor 108 receives anti-blooming transistor control signal AB_E2. A gate terminal of transfer transistor 116 receives transfer transistor control signal TG_E1. A gate terminal of transfer transistor 112 receives transfer transistor control signal TG_E2. A gate terminal of transfer transistor 110 receives transfer transistor control signal SG_E2. A gate terminal of reset transistor 124 receives reset transistor control signal RAG. A gate terminal of row select transistor 128 receives row select transistor control signal SEL. A gate terminal of dual conversion gain transistor 120 receives dual conversion gain transistor control signal DCG.

During operation of imaging pixel 22, photodiodes 102 and 106 may generate charge (e.g., electrons) in response to receiving impinging photons. The amount of charge that is collected by photodiodes 102 and 106 depends on the intensity of the impinging light and the exposure duration (or integration time). Photodiodes 102 and 106 may be formed from a doped semiconductor region (e.g., a region in a silicon substrate that is doped by ion implantation, impurity diffusion, or other doping process). Storage diode 104 and floating diffusion region 118 may also optionally be formed from a doped semiconductor region.

To help increase dynamic range in the image sensor, photodiodes 102 and 106 may have different sensitivities. For example, photodiode 106 may have a higher sensitivity than photodiode 102. To provide photodiode 106 with a higher sensitivity than photodiode 102, photodiode 106 may have a larger light collecting area than photodiode 102. The doping profile used to form photodiodes 102 and 106 may also be different to help vary the sensitivity.

Photodiodes 102 and 106 may collect light during an integration time. During the integration time, charge in photodiode 102 may alternately be drained to bias voltage terminal 130 and transferred to charge storage region 104 according to a flicker mitigation scheme. Image artifacts may sometimes be caused by moving objects, moving or shaking camera, flickering lighting, and objects with changing illumination in an image frame. Such artifacts may include, for example, missing parts of an object, edge color artifacts, and object distortion. Examples of objects with changing illumination include light-emitting diode (LED) traffic signs (which can flicker several hundred times per second) and LED brake lights or headlights of modern cars. Without performing flicker mitigation operations, the image sensor may acquire light asynchronously relative to the scenery being captured. This means that portions of an image frame may not be exposed for part of the frame duration. This is especially true for bright scenery when integration times are much shorter than the frame time used. Zones in an image frame that are not fully exposed to dynamic scenery may result in object distortion, ghosting effects, and color artifacts when the scenery includes moving or fast-changing objects. Similar effects may be observed when the camera is moving or shaking during image capture operations.

To mitigate artifacts caused by LED flickering in a scene, each imaging pixel includes a shutter element (e.g., anti-blooming transistor 108) for controlling when photosensitive element 102 acquires charge. For example, when anti-blooming transistor 108 is deasserted, charge may accumulate in photodiode 102. When anti-blooming transistor 108 is asserted, charge may be drained out from photodiode 102 and discarded. Anti-blooming transistor 108 may be operated dynamically by being opened and closed multiple times throughout the duration of an imaging frame. Each cycle of dynamic shutter operation may include a period of time when the shutter is 'open' (e.g., when anti-blooming transistor 108 is deasserted) and a period of time when the shutter is 'closed' (e.g., when anti-blooming transistor 108 is asserted). At the end of each cycle, the charge that has been acquired on the photosensitive element during the cycle may be transferred from photodiode 102 to charge storage region 104 by asserting transfer transistor 110. By repeating this sequence multiple times, the charge accumulated on charge storage region 104 may represent the entire scenery being captured without significantly unexposed "blind" time spots.

Also during operation of imaging pixel 22, charge may overflow from charge storage region 104 to floating diffusion region 118. If enough charge accumulates in floating diffusion region 118, charge may also overflow from floating diffusion region 118 to dual conversion gain capacitor 122.

Dual conversion gain transistor 120 and dual conversion gain capacitor 122 may be used by pixel 22 to implement a dual conversion gain mode. In particular, pixel 22 may be operable in a high conversion gain mode and in a low conversion gain mode. In general, conversion gain is inversely proportional to the capacitance of the floating diffusion region. Therefore, if gain select transistor 120 is deasserted, DCG capacitor 122 is not coupled to the floating diffusion region and pixel 22 will be placed in a high conversion gain mode. If gain select transistor 120 is asserted, DCG capacitor 122 is coupled to the floating diffusion region and pixel 22 will be placed in a low conversion gain mode.

When dual conversion gain transistor 120 is asserted, the dual conversion gain capacitor 122 may be switched into use to provide floating diffusion region 118 with additional capacitance. This results in lower conversion gain for pixel 22. When dual conversion gain transistor 120 is deasserted, the additional loading of the capacitor is removed and the pixel reverts to a relatively higher pixel conversion gain configuration.

Ultimately, after the integration time is complete, charge may be read out from photodiode 106, charge storage region 104, floating diffusion region 118, and dual conversion gain capacitor 122. The operation of pixel 22 of FIG. 3 is described in more detail in FIGS. 4 and 5. Any desired combination of high conversion gain readouts and low conversion gain readouts may be used in reading out charge from imaging pixel 22.

Figure 4:
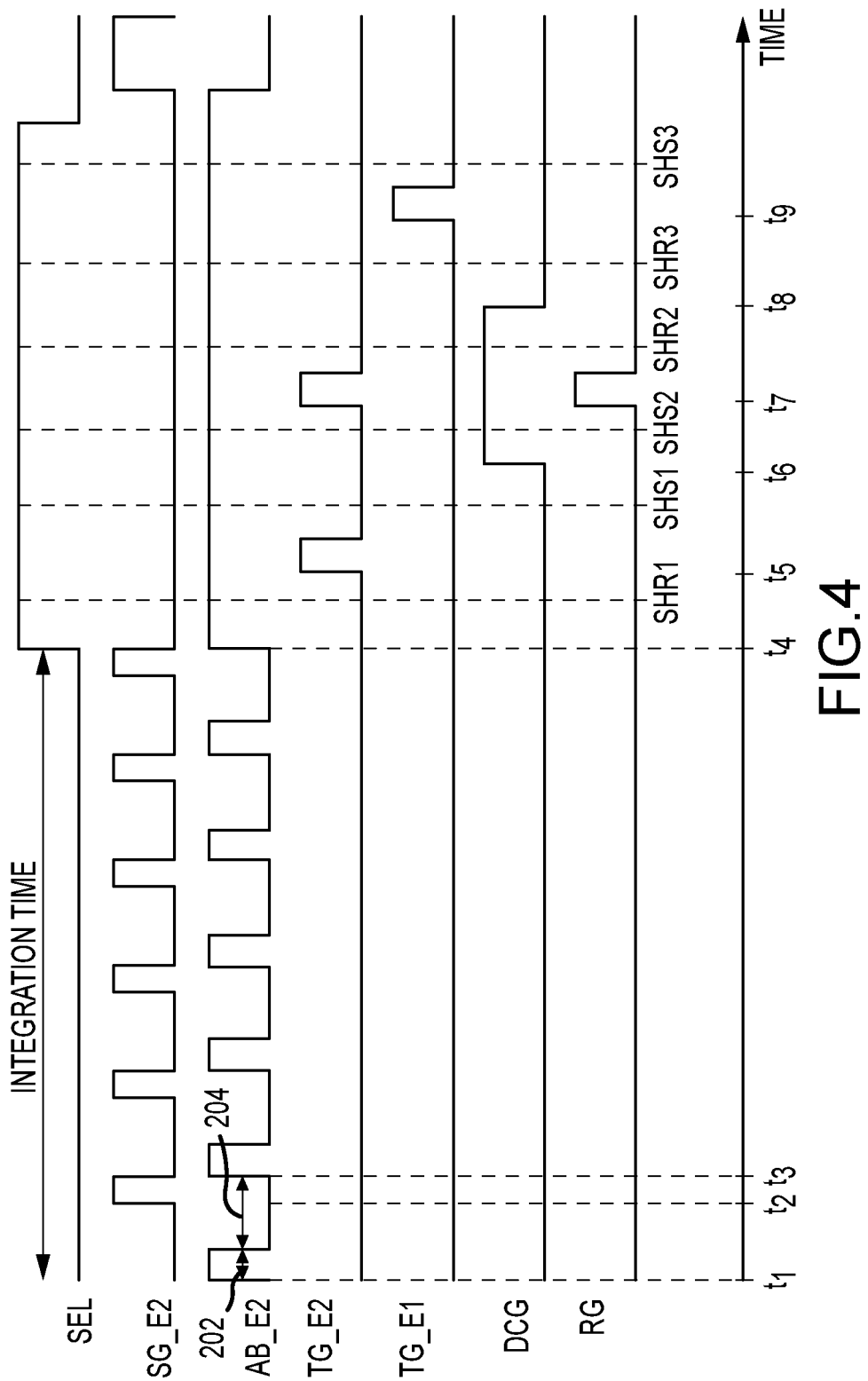
FIG. 4 is a timing diagram showing an illustrative method of operating the imaging pixel of FIG. 3 in accordance with an embodiment.
Figure 5:
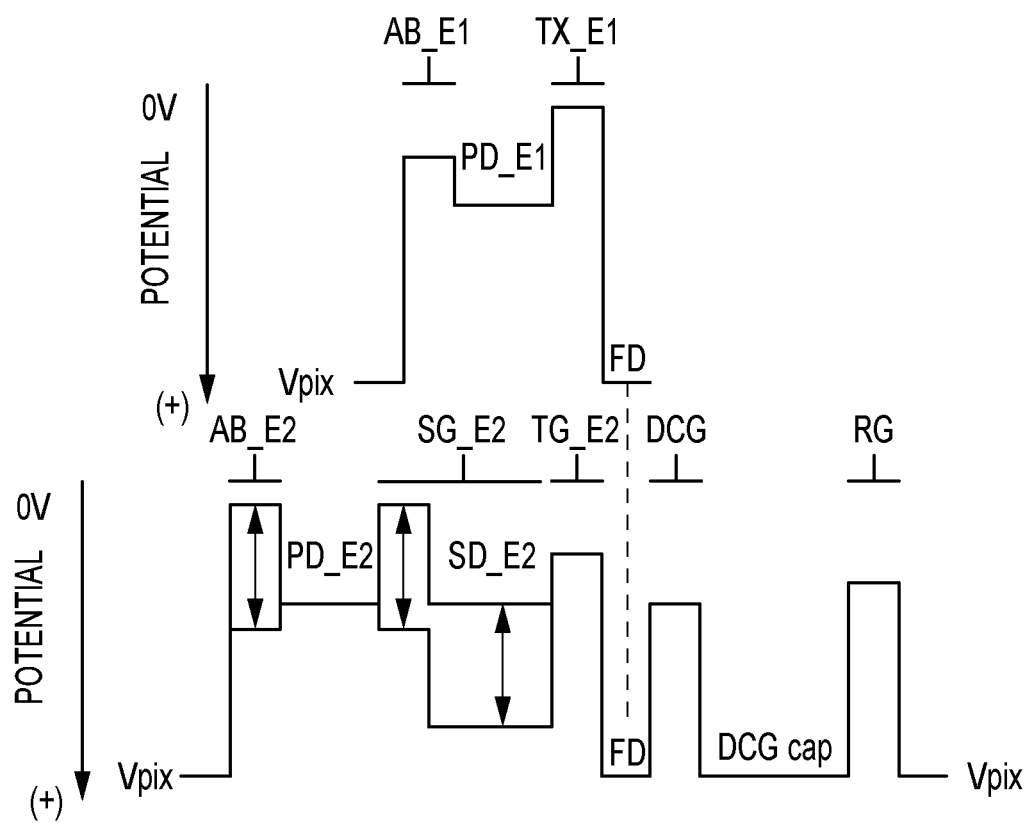
FIG. 5 is a potential diagram showing the potential across the imaging pixel of FIG. 3 in accordance with an embodiment.

FIG. 4 is a timing diagram showing operation of the pixel of FIG. 3. FIG. 5 is a potential diagram showing how the potential varies across the image sensor to control overflow of charge.

As shown in FIG. 4, the integration time for a given frame may begin at time $t_1$. The integration time may continue from $t_1$ to $t_4$. During the integration time, charge may be generated by photodiodes 102 and 106. Transfer transistor 116 may remain deasserted throughout the integration time (e.g., TG_E1 remains low), meaning that charge in photodiode 106 accumulates in photodiode 106 for the entire integration time.

In contrast, charge in photodiode 102 may alternately be discarded to bias voltage supply terminal 130 and integrated and transferred to charge storage region 104 for flicker mitigation. A representative shutter cycle for flicker mitigation is shown between times $t_1$ and $t_3$. At $t_1$, anti-blooming transistor control signal AB_E2 is asserted. During this time period, charge from photodiode 102 is coupled to bias voltage supply terminal 130 and discarded. Then, AB_E2 is deasserted and charge will accumulate in photodiode 102. The charge in photodiode 102 will then be transferred to charge storage region 104 at $t_2$ (when SG_E2 is raised high).

In this representative shutter cycle, charge is discarded during first time period 202 then integrated during second time period 204. Importantly, the relative lengths of time periods 202 and 204 may help set the dynamic range of the image sensor. To increase the dynamic range of the image sensor, the length of time period 202 relative to time period 204 in each cycle may be increased. The cycle shown between $t_1$ and $t_3$ is repeated for the duration of the integration time. At the end of each shutter cycle, charge is transferred to charge storage region 104.

Charge may overflow from charge storage region 104 to floating diffusion region 118 and/or dual conversion gain capacitor 122. As shown in the potential diagram of FIG. 5, the potential of transfer transistor 112 (set by TG_E2) is lower than the potential of transistor 110 when transistor 110 is deasserted (set by SG_E2). This means that when enough charge accumulates in charge storage region 104, charge will overflow through transfer transistor 112 into floating diffusion region 118 (FD).

Similar to charge storage region 104, floating diffusion region 118 can only store a limited amount of charge. When the amount of charge present exceeds the capacity of floating diffusion region 118, charge will overflow through dual conversion gain transistor 120 (having a potential set by dual conversion gain control signal DCG) into dual conversion gain capacitor 122 (DCG CAP).

Also shown in FIG. 5 is how the potential of reset transistor 124 (set by control signal RG) is selected to be lower than dual conversion gain transistor 120. This ensures that overflow charge from the floating diffusion region will overflow through the dual conversion gain transistor without overflowing through reset transistor 124 to Vpix.

Returning to FIG. 4, the integration time may conclude at time $t_4$. At $t_4$, charge may be present in photodiode 106 that has accumulated during the integration time. Charge generated in photodiode 102 will be present in charge storage region 104 (having been repeatedly transferred from PD_E2 to SD_E2 during the shutter cycles). Depending on the amount of charge generated, there may also be overflow charge present in floating diffusion region 118 (from photodiode 102 via charge storage region 104) and the dual conversion gain capacitor (from photodiode 102 via floating diffusion region 118 and charge storage region 104).

At $t_4$, readout operations may begin. Row select transistor 128 may be asserted at $t_4$ (by asserting SEL). As previously mentioned, during readout operations the state of dual conversion gain transistor 120 may set the conversion gain of the readout. When dual conversion gain transistor 120 is asserted, low conversion gain readout may be performed. When dual conversion gain transistor 120 is deasserted, high conversion gain readout may be performed.

The first readout operation performed may be a high conversion gain readout of the amount of charge present in charge storage region 104. Transfer transistor 112 may be asserted at $t_5$ to transfer charge from charge storage region 104 to floating diffusion region 118. Before this transfer, the reset level of floating diffusion region 118 may be obtained (see SHR1). After this transfer, the signal level of floating diffusion region 118 may be obtained (see SHS1).

This technique of sampling the floating diffusion region before and after the charge transfer may be referred to as correlated double sampling (CDS). The reset level may be subtracted from the signal level by processing circuitry to determine how much charge was present in charge storage region 104.

Next, a low conversion gain readout of the amount of charge present in floating diffusion region 118 and dual conversion gain capacitor 122 may be performed. This may be referred to as the second readout operation. In the first readout operation, charge from storage diode 104 was transferred to floating diffusion region 118. So in effect, by measuring the amount of charge in the floating diffusion region and the dual conversion gain capacitor during the second readout, the second readout operation measures the amount of total charge that was present in charge storage region 104, floating diffusion region 118, and dual conversion gain capacitor 122 at $t_4$.

Uncorrelated double sampling may be used for the second readout. At $t_6$, dual conversion gain transistor 120 is asserted. This places the pixel in a low conversion gain mode and enables readout of charge on dual conversion gain capacitor 122. The signal level for the second readout is obtained at SHS2 (e.g., the amount of charge present in the floating diffusion region and dual conversion gain capacitor is sampled). The floating diffusion region is then reset at $t_7$ by asserting reset transistor 124. This clears accumulated charge from floating diffusion region 118 and dual conversion gain capacitor 122. Transfer transistor 112 is asserted in parallel with the reset transistor at $t_7$. This ensures that storage diode 104 is also cleared of all accumulated charge. After reset is complete, a reset level may be sampled at SHR2. Because the reset level is sampled after the signal level in the second readout, the second readout is referred to as an uncorrelated double sampling readout. In uncorrelated double sampling, reset sampling occurs after signal sampling (instead of before signal sampling as in correlated double sampling). Uncorrelated double sampling may not be as accurate as correlated double sampling (due to noise that is not accounted for in uncorrelated double sampling). However, uncorrelated double sampling may still provide improved image data compared to using no double sampling of any type.

At $t_8$, dual conversion gain transistor 120 may be deasserted, returning the imaging pixel to a high conversion gain readout mode for the third readout operation. During the third readout operation, charge from photodiode 106 may be transferred from the photodiode to floating diffusion region 118 at $t_9$ by asserting TG_E1. Before this transfer, the reset level of floating diffusion region 118 may be obtained (see SHR3). After this transfer, the signal level of floating diffusion region 118 may be obtained (see SHS3). Correlated double sampling is therefore used in the third readout. The reset level may later be subtracted from the signal level by processing circuitry to determine how much charge was present in photodiode 106.

Anti-blooming transistor 108 may be asserted throughout readout operations to ensure that charge generated by photodiode 102 after the integration time ends is discarded (and does not impact the stored charges in the storage diode, floating diffusion region, and DCG capacitor).

As previously mentioned, the ratio of time period 202 (sometimes referred to as $T_{DISCARD}$) to time period 204 (sometimes referred to as $T_{INT}$) may help set the dynamic range of the imaging pixel. As $T_{DISCARD}$ increases, the dynamic range of the imaging pixel will increase (because a higher, known percentage of incident light is disposed of) but the image quality may be worse (as sensitivity will be lowered). As $T_{DISCARD}$ decreases, the dynamic range of the imaging pixel will decrease but image quality will increase. Any desired ratio of $T_{DISCARD}$ to $T_{INT}$ may be used in operating the imaging pixel. The ratio may remain the same throughout the integration time for a given frame or may vary within the integration time for a given frame.

In some cases, the ratio of $T_{DISCARD}$ to $T_{INT}$ may be selected by a user. For example, a user may select the ratio using an input device (e.g. input device 19 in FIG. 1) of the imaging system. In other cases, the ratio of $T_{DISCARD}$ to $T_{INT}$ may be updated (adjusted) by the processing circuitry (e.g. processing circuitry 18) of the imaging system. In one illustrative example, the ratio of $T_{DISCARD}$ to $T_{INT}$ for a given frame may be selected by the processing circuitry based on data from one or more previous frames. Any desired ratio of $T_{DISCARD}$ to $T_{INT}$ may be used when operating the imaging pixel. The ratio of $T_{DISCARD}$ to $T_{INT}$ may be 1:1, more than 1:1, more than 2:1, more than 4:1, more than 8:1, more than 10:1, more than 16:1, more than 20:1, less than 1:1, less than 2:1, less than 4:1, less than 8:1, less than 10:1, less than 16:1, less than 20:1, more than 1:2, more than 1:4, more than 1:8, more than 1:10, more than 1:16, more than 1:16, less than 1:2, less than 1:4, less than 1:8, less than 1:10, less than 1:16, less than 1:20, between 4:1 and 12:1, between 2:1 and 6:1, between 8:1 and 16:1, etc. The ratio of $T_{DISCARD}$ to $T_{INT}$ may be the same for all of the imaging pixels in the pixel array or may vary for each imaging pixel within the pixel array. This ratio may sometimes be referred to as the $T_{DISCARD}$ duty cycle or simply duty cycle.

The signals from the three readouts of the imaging pixel may be used (e.g., combined) by processing circuitry in the imaging system to form a single representative high dynamic range image. The resulting high dynamic range image will not be affected by LED flicker in the scene due to the flicker mitigation techniques used during the integration time. The dynamic range of the image produced by the image sensor including the imaging pixels of FIG. 3 may be greater than 120 decibels (dB).

Controlling dynamic range using the ratio of $T_{DISCARD}$ to $T_{INT}$ may allow for the dual conversion gain capacitor to have a reduced size. The size of the dual conversion gain capacitor may be increased to increase dynamic range. However, because dynamic range can be increased by increasing the ratio of $T_{DISCARD}$ to $T_{INT}$, the dual conversion gain capacitor can have a reduced size while still maintaining high dynamic range.

Figure 6:
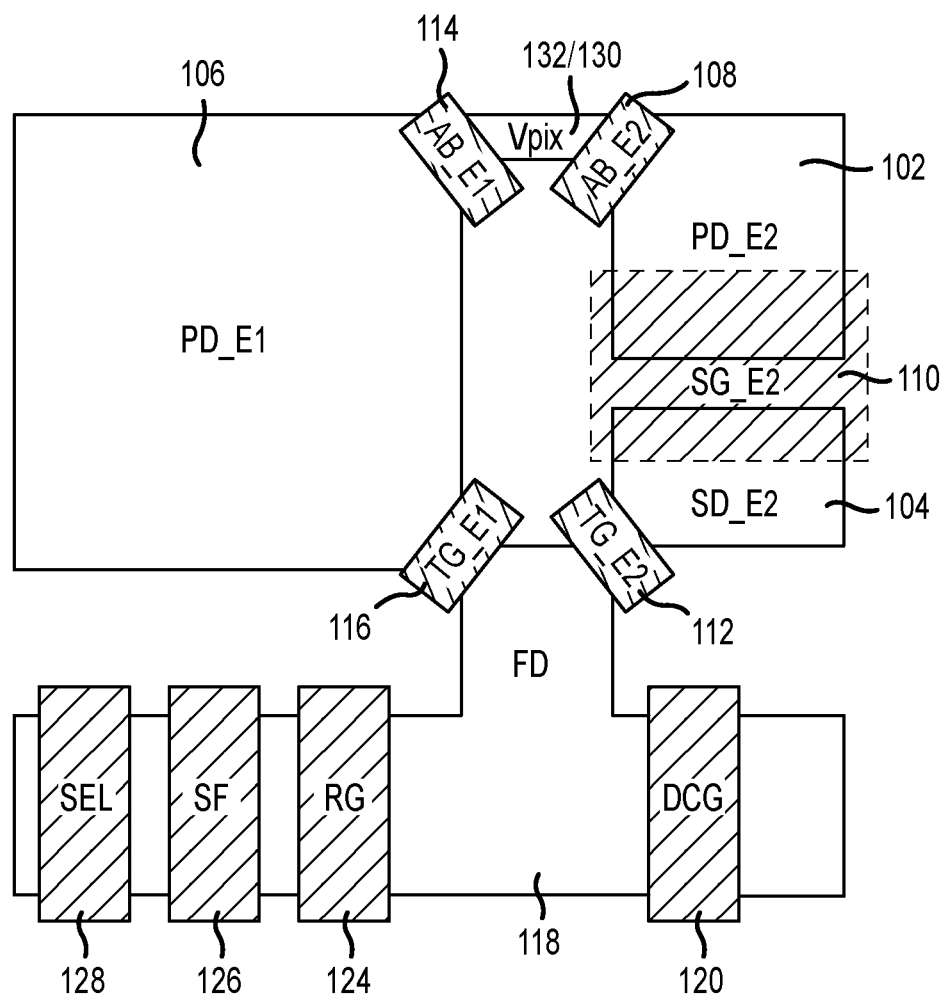
FIG. 6 is a top view of the illustrative imaging pixel of FIG. 3 showing how the first and second photodiodes have different sizes and sensitivities in accordance with an embodiment.

FIG. 6 is a top view of the imaging pixel shown in FIG. 3. FIG. 6 shows the relative placement of the components of the imaging pixel. Anti-blooming transistor 114 may be positioned in a corner of photodiode PD_E1. Transfer transistor 116 may be positioned in another corner of photodiode PD_E1. Photodiode PD_E2 is positioned adjacent to PD_E1. This allows for a bias voltage supply terminal to be interposed between the photodiodes and shared between the photodiodes. As shown, bias voltage supply terminals 130 and 132 are formed form a single bias voltage supply terminal in this embodiment. Similarly, floating diffusion region 118 is interposed between the storage diode SD_E2 and PD_E1 and shared between the diodes. Transfer transistors 116 and 112 are both configured to transfer charge to floating diffusion region 118. Storage diode 104 may be shielded from incident light to prevent undesired charge from being generated in the storage diode.

FIG. 6 shows how photodiode 102 may be less sensitive to incident light than photodiode 106. Photodiode 102 has a smaller light collecting area than photodiode 106. PD_E1 may have a sensitivity that is more than 2 times greater than the sensitivity of PD_E2, more than 4 times greater than the sensitivity of PD_E2, more than 6 times greater than the sensitivity of PD_E2, more than 8 times greater than the sensitivity of PD_E2, more than 10 times greater than the sensitivity of PD_E2, less than 10 times greater than the sensitivity of PD_E2, etc.

In some embodiments, the imaging pixel of FIG. 3 may be formed as part of a stacked die arrangement in which some of the imaging pixel is formed in a first semiconductor die and some of the imaging pixel is formed in a second semiconductor die. In these types of embodiments, a conductive interconnect layer may be positioned between the two dies at location 302 in FIG. 3. In other words, photodiode 102, storage diode, 104, photodiode 106, anti-blooming transistors 114 and 108, and transfer transistors 110, 112, and 116 may all be formed in a first semiconductor substrate. Reset transistor 124, source follower transistor 126, row select transistor 128, floating diffusion region 118, dual conversion gain transistor 120, and dual conversion gain capacitor 122 may all be formed in a second semiconductor substrate that is connected to the first semiconductor substrate by the conductive interconnect layer. This example is merely illustrative. In general, the components of FIG. 3 may be split between two or more semiconductor substrates in any desired manner.

The foregoing is merely illustrative and various modifications can be made to the described embodiments. The foregoing embodiments may be implemented individually or in any combination.

What is claimed is:

1. An imaging system including an image sensor with an array of imaging pixels and processing circuitry, each imaging pixel comprising:
    a first photodiode with a first sensitivity to incident light;
    a second photodiode with a second sensitivity to incident light, wherein the second sensitivity is less than the first sensitivity;
    a charge storage region;
    a bias voltage supply terminal;
    a first transistor interposed between the second photodiode and the charge storage region;
    a second transistor interposed between the second photodiode and the bias voltage supply terminal, wherein the first and second transistors are alternately asserted during an integration time and wherein the processing circuitry is configured to adjust a ratio of a length of time for which the second transistor is asserted to a length of time for which the second transistor is not asserted during the integration time to control dynamic range;
    a dual conversion gain capacitor;
    a first semiconductor substrate, wherein the first photodiode, the second photodiode, and the charge storage region are formed in the first semiconductor substrate; and
    a second semiconductor substrate, wherein the dual conversion gain capacitor is formed in the second semiconductor substrate.

2. The imaging system defined in claim 1, each imaging pixel further comprising:
    a floating diffusion region; and
    a third transistor interposed between the charge storage region and the floating diffusion region.

3. The imaging system defined in claim 2, each imaging pixel further comprising:
    a fourth transistor interposed between the first photodiode and the floating diffusion region.

4. The imaging system defined in claim 3, each imaging pixel further comprising:
    a fifth transistor interposed between the floating diffusion region and the dual conversion gain capacitor.

5. The imaging system defined in claim 4, each imaging pixel further comprising:
    a source follower transistor having a gate terminal coupled to the floating diffusion region;
    a row select transistor coupled to the source follower transistor; and
    a reset transistor coupled to the floating diffusion region.

6. The imaging system defined in claim 5, each imaging pixel further comprising:
    a sixth transistor interposed between the first photodiode and the bias voltage supply terminal.

7. The imaging system defined in claim 6, wherein the first transistor, the second transistor, the third transistor, the fourth transistor, and the sixth transistor are formed in the first semiconductor substrate and wherein the fifth transistor, the floating diffusion region, the source follower transistor, the row select transistor, and the reset transistor are formed in the second semiconductor substrate.

8. The imaging system defined in claim 1, wherein the processing circuitry is configured to adjust the ratio based on received user input.

9. The imaging system defined in claim 1, wherein the processing circuitry is configured to adjust the ratio for a given frame based on image data from previous frames.

10. An imaging system having an image sensor, an input device, and processing circuitry, the image sensor having an array of imaging pixels, each imaging pixel comprising:
    a first photodiode with a first sensitivity to incident light;
    a second photodiode with a second sensitivity to incident light, wherein the second sensitivity is less than the first sensitivity, wherein the first photodiode has a larger light collecting area than the second photodiode to increase sensitivity relative to the second photodiode, and wherein the first photodiode has a different doping profile than the second photodiode to increase sensitivity relative to the second photodiode;
    a charge storage region;
    a first transistor coupled between the second photodiode and the charge storage region;
    a floating diffusion region;
    a second transistor coupled between the charge storage region and the floating diffusion region;
    a bias voltage supply terminal;
    a third transistor coupled between the second photodiode and the bias voltage supply terminal, wherein a shutter cycle in which the third transistor is asserted is repeated during an integration time and wherein the processing circuitry is configured to select an amount of time for which the third transistor is asserted in each shutter cycle based on user input received by the input device.

11. The imaging system defined in claim 10, each imaging pixel further comprising:
    a fourth transistor coupled between the second photodiode and the floating diffusion region.

12. The imaging system defined in claim 11, each imaging pixel further comprising:
    a fifth transistor coupled between the additional photodiode and the bias voltage supply terminal.

13. The imaging system defined in claim 12, each imaging pixel further comprising:
    a dual conversion gain capacitor;
    a sixth transistor coupled between the floating diffusion region and the dual conversion gain capacitor;
    a source follower transistor having a gate terminal coupled to the floating diffusion region; and
    a reset transistor coupled to the floating diffusion region.

14. A method of operating imaging pixel in an image sensor, wherein the imaging pixel includes a photodiode, an additional photodiode having a higher sensitivity than the photodiode, a charge storage region, a first transfer transistor coupled between the photodiode and the charge storage region, a floating diffusion region, a second transfer transistor coupled between the charge storage region and the floating diffusion region, an anti-blooming transistor coupled to the photodiode, an additional anti-blooming transistor coupled to the additional photodiode, a third transfer transistor coupled between the additional photodiode and the floating diffusion region, a source follower transistor having a gate coupled to the floating diffusion region, a dual conversion gain capacitor, a dual conversion gain transistor coupled between the floating diffusion region and the dual conversion gain capacitor, and a reset transistor coupled to the floating diffusion region, the method comprising:
    during an integration time, generating charge with the photodiode in response to incident light;
    during the integration time, generating charge with the additional photodiode in response to the incident light;

during the integration time, performing flicker mitigation operations, wherein performing the flicker mitigation operations comprises repeatedly asserting the anti-blooming transistor then asserting the first transfer transistor in cycles, wherein a ratio of a length of time for which the anti-blooming transistor is asserted compared to a length of time for which the anti-blooming transistor is not asserted in each cycle is set to control dynamic range;

after the integration time, performing a first readout operation, wherein performing the first readout operation comprises sampling a reset level of the floating diffusion region, asserting the second transfer transistor, and sampling a signal level of the floating diffusion region; and after performing the first readout operation, performing a second readout operation, wherein performing the second readout operation comprises sampling a signal level of the floating diffusion region while the dual conversion gain transistor is asserted, asserting the reset transistor, and sampling a reset level of the floating diffusion region.

15. The method defined in claim 14, further comprising:
after performing the second readout operation, performing a third readout operation, wherein performing the third readout operation comprises sampling a reset level of the floating diffusion region while the dual conversion gain transistor is not asserted, asserting the third transfer transistor, and sampling a signal level of the floating diffusion region.

16. The method defined in claim 15, wherein performing the first readout operation comprises performing a first high conversion gain readout operation, wherein performing the second readout operation comprises performing a low conversion gain readout operation, and wherein performing the third readout operation comprises performing a second high conversion gain readout operation.

* * * * *